United States Patent
Zamprogno (12)

(10) Patent No.: US 11,581,892 B2
(45) Date of Patent: Feb. 14, 2023

(54) METHOD OF DRIVING A CAPACITIVE LOAD, CORRESPONDING CIRCUIT AND DEVICE

(71) Applicant: STMicroelectronics S.r.l., Agrate Brianza (IT)

(72) Inventor: Marco Zamprogno, Cesano Maderno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 539 days.

(21) Appl. No.: 16/738,419

(22) Filed: Jan. 9, 2020

(65) Prior Publication Data

US 2020/0233206 A1 Jul. 23, 2020

(30) Foreign Application Priority Data

Jan. 23, 2019 (IT) .......................... 102019000001023

(51) Int. Cl.
*H03K 17/687* (2006.01)
*H01L 41/04* (2006.01)
*H03K 4/02* (2006.01)

(52) U.S. Cl.
CPC ....... *H03K 17/6874* (2013.01); *H01L 41/042* (2013.01); *H03K 4/023* (2013.01)

(58) Field of Classification Search
CPC ... H03K 17/6874; H03K 4/023; H01L 41/042
See application file for complete search history.

(56) References Cited

U.S. PATENT DOCUMENTS

| | | | | |
|---|---|---|---|---|
| 2008/0238527 A1* | 10/2008 | Bolz | ..................... | H02J 7/0014 307/10.6 |
| 2010/0321089 A1 | 12/2010 | Choy | | |
| 2011/0018919 A1 | 1/2011 | Oshima et al. | | |

FOREIGN PATENT DOCUMENTS

| | | |
|---|---|---|
| DE | 19858250 A1 | 6/2000 |
| EP | 3206278 A1 | 8/2017 |

* cited by examiner

*Primary Examiner* — Jung Kim
(74) *Attorney, Agent, or Firm* — Slater Matsil, LLP

(57) ABSTRACT

A method includes pre-charging a parasitic capacitance of a control node that is coupled to a control terminal of first and second transistors that have respective current paths that form a switched current path coupled between a load node and a storage node. Pre-charging the parasitic capacitance includes: making conductive a first auxiliary transistor that has a current path coupled between the storage node and the control node, or making conductive a second auxiliary transistor that has a current path coupled between the load node and the control node. The method further includes, after pre-charging the parasitic capacitance, making the switched current path conductive to couple the load node to the storage node.

20 Claims, 7 Drawing Sheets

METHOD OF DRIVING A CAPACITIVE LOAD, CORRESPONDING CIRCUIT AND DEVICE

CROSS-REFERENCE TO RELATED APPLICATIONS

This application claims priority to Italian Patent Application No. 102019000001023, filed on Jan. 23, 2019, which application is hereby incorporated herein by reference.

TECHNICAL FIELD

The present disclosure relates generally to an electronic system and method, and, in particular embodiments, to a method of driving a capacitive load, corresponding circuit and device.

BACKGROUND

In a charge reuse driver, a load, e.g., a capacitance, may be driven by a substantially trapezoidal signal switching between ground (0 Volts) and a high voltage VHV through rising and falling edges, which are defined by a set of sub-steps, e.g., a number N of steps.

Such a signal may result from a stepped exchange of charge (and/or high voltage VHV) between a load capacitance and storage "tank" capacitances. The exchange of charge includes a set of intermediate sub-steps. For instance, in each sub-step, a tank capacitance may store a respective intermediate voltage, e.g., an n-th fraction of the voltage VHV.

During a periodic switching of the load capacitance from ground to VHV, in each sub-step, the load capacitance itself may be charged or discharged (e.g., depending on whether it is performed during the rising or falling edge of the periodic signal, respectively) through the tank capacitors.

For a single sub-step, the amount of charge gained from the load capacitance during the rising edge may be (asymptotically) equal to the amount of charge lost during the falling edge. Thus, the load capacitance may, e.g., continuously, exchange charge with the tank capacitors.

During the last sub-step of the falling edge, e.g., when the load capacitor is effectively discharged to ground, the charge stored in the load capacitance is lost. Such charge is subsequently recovered during the last sub-step of the rising edge, e.g., when load capacitor is connected to the supply VHV. Charge reuse drivers as known in the art provide power dissipation reduced by a factor (N−1), where N may be the number of the sub-steps.

Charge reuse drivers may be adopted in low-voltage applications.

It is noted that voltages involved in driving loads such as micro-mirrors may often vary considerably, e.g., with trapezoidal signals possibly oscillating up to a high voltage VHV value (e.g., VHV=40 V). Moreover, micro-mirrors may have intrinsic capacitances of several nF, and resonance frequencies up to tens of kHz.

Power dissipation may thus be a figure of merit deserving consideration.

SUMMARY

Applying charge reuse drivers to piezoelectric loads, e.g., to resonant micro-mirrors, may be desirable.

Some embodiments relate to driving capacitive loads, such as piezoelectric loads, such as micro-mirrors.

One or more embodiments may be applied to so-called charge reuse drivers, including electronic switches, for instance high voltage and low resistance switches with fast and efficient turn-on time.

One or more embodiments relate to a method of driving a capacitive load, such as a piezoelectric load.

One or more embodiments relate to a corresponding circuit.

One or more embodiments relate to a corresponding device. A device comprising a charge reuse driver and a piezoelectric load (e.g., a micro-mirror) driven thereby may be exemplary of such a device.

In one or more embodiments, improved performance may be facilitated in a charge reuse driver via an increasing number of sub-steps N.

In one or more embodiments, time devoted to rise/fall edges may be reduced (i.e., increasing the resonance frequency).

In one or more embodiments, switching operation may use short switch turn-on times (so that rise/fall times are not appreciably affected) and (very) low switch resistance.

One or more embodiments may involve a high-voltage switch with low resistance and (very) low turn-on times.

In one or more embodiments, high-voltage switch devices may facilitate transferring voltages (e.g., up to 40 V) between load and tank (or storage) capacitances, in either direction.

One or more embodiments may adopt efficient driving circuits with well controlled safe operation area (SOA) constraints. In that respect, one or more embodiments may be based on the recognition that the turn-on transient time and the final DC resistance in a conventional switch circuit may be limited by a limited on-set resistance $r_{ON}$, by non-negligible parasitic capacitances, and by SOA constraints.

One or more embodiments may be based on the recognition that resorting to a set of N intermediate sub-steps may facilitate reducing power dissipation in the load (which may be expressed as the product of capacitance, voltage squared and frequency, that is $P=C \cdot V^2 \cdot f$) by a scale factor proportional to the number N of steps.

One or more embodiments may comprise charge reuse drivers suitable for use in high voltage applications, in which a capacitive load being driven through a periodic signal. In such applications, the power dissipation is proportional to the square of the driving voltage accordingly to the formula $P=C \cdot f \cdot V^2$, where C is the load capacitance, f is the switching frequency and V is the driving voltage.

Letting each sub-step in the set of steps of the charge reuse driver (e.g., each tank capacitance) complete its transient phase—either charging or discharging the RC circuit—e.g., with 4 to 5 RC time constants may facilitate benefitting from power consumption reduction.

On the other hand, reducing rise and fall times may be desirable in order to improve the power efficiency in applying the driving signal to the load.

BRIEF DESCRIPTION OF THE DRAWINGS

One or more embodiments will now be described, by way of non-limiting example only, with reference to the annexed Figures, wherein.

DETAILED DESCRIPTION OF ILLUSTRATIVE EMBODIMENTS

Figure 1:
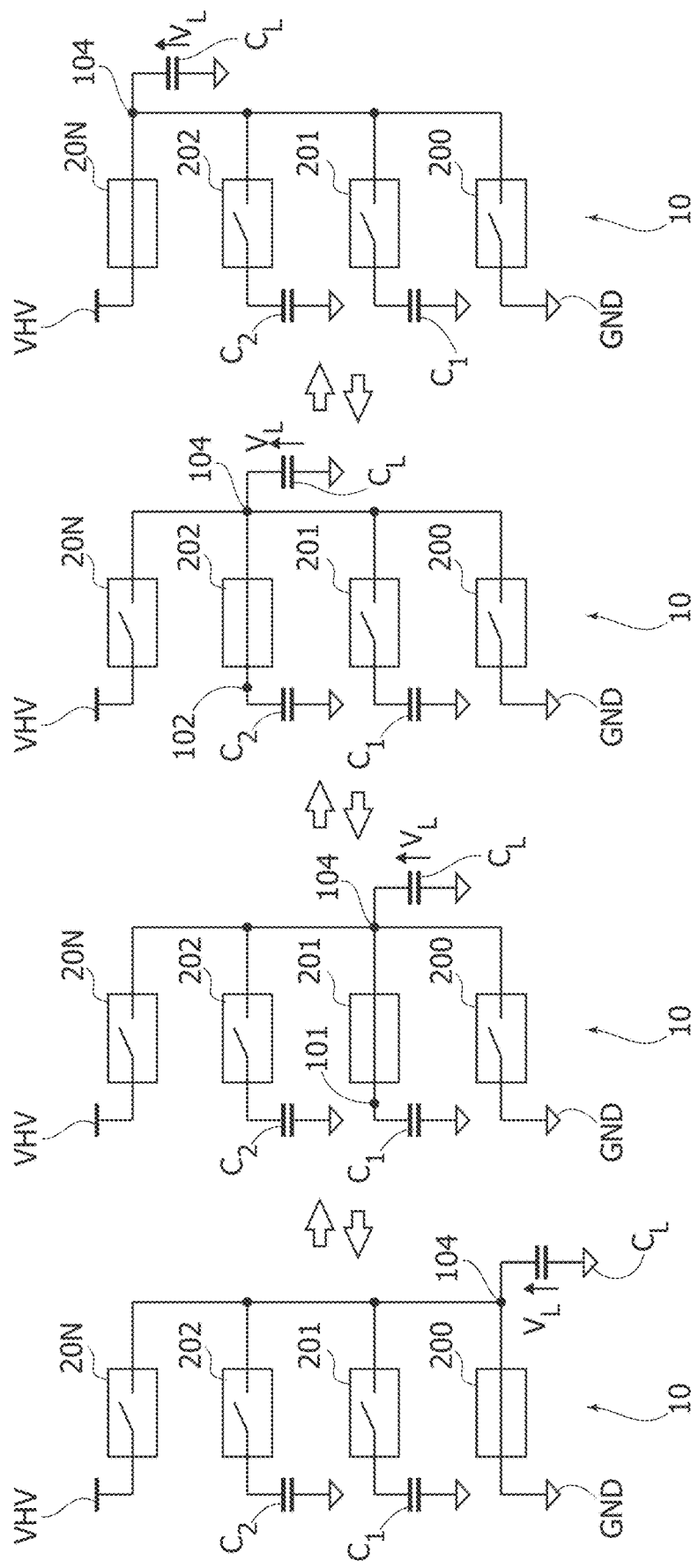
FIGS. 1A-1D are exemplary of principles underlying one or more embodiments as per the present disclosure.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

Throughout the instant description of ordinal numbers, (e.g., first, second, third, . . . ) will be used with the purpose of facilitating the identification of components. It will be otherwise appreciated that such ordinal numbers are merely intended for that purpose and shall not be construed, even indirectly, in a limiting sense of the embodiments.

By way of introduction to a detailed description of exemplary embodiments, reference may be first had to FIGS. 1A-1D.

FIGS. 1A-1D are exemplary of working principles of a charge reuse driver 10, e.g., which, as exemplified herein, may be used to drive a capacitive load $C_L$, e.g., a piezoelectric actuator such as a micro-mirror.

The charge reuse driver 10 may comprise a number N of sub-stages in which charge may be redistributed sequentially between the capacitive load $C_L$ and the N sub-stages. For the sake of simplicity, in the exemplary charge-reuse driver 10 of FIGS. 1A-1D, a number N=4 of four sub-stages is discussed, being otherwise understood that one or more embodiments may comprise virtually any number N of sub-stages.

In one or more embodiments the charge reuse driver 10 may comprise a set of N switches 200, 201, 202, 20N, e.g., four switches 200, 201, 202, 20N.

In one or more embodiments, the number N of sub-stages in the charge reuse driver may comprise:

a voltage supply node VHV, e.g., a high voltage supply node with a voltage level, e.g., higher than 30 V, such as, e.g., of 40 V or higher;

a ground node GND; and a set of storage or "tank" capacitances $C_1$, $C_2$, having respective charge nodes 101, 102.

In one or more embodiments, for instance:

a ground node GND may be couplable to the charge node 104 of the load capacitance $C_L$ via a first switch 200;

a first storage capacitance $C_1$ may have its charge node 101 couplable to the charge node 104 of the load capacitance $C_L$ via a second switch 201;

a second storage capacitance $C_2$, e.g., equal to the second storage capacitance $C_1$, may have its charge node 102 couplable to the charge node 104 of the load capacitance $C_L$ via a third switch 202; and the voltage supply VHV may be couplable to the charge node 104 of the capacitive load $C_L$ via a fourth switch 20N.

In one or more embodiments, switches in the set of N switches 200, 201, 202, 20N may be configured to drive the charge node 104 of the capacitive load $C_L$ by applying thereto a sequence of rising and falling edges of a voltage signal. For instance, providing such rising and falling edges may comprise performing stages of an ordered sequence, shown in respective FIGS. 1A, 1B, 1C, and 1D.

In one or more embodiments, a controller (not visible in FIGS. 1A-1D) may operate the reusable charge driver 10 to perform the sequence as exemplified in FIGS. 1A-1D.

In the following, operating principles are discussed with respect to providing a rising edge, for instance initiating the sequence at FIG. 1A when:

the load capacitance $C_L$ may be discharged; and the "tank" storage capacitances $C_1$, $C_2$ may store a respective equal portion of charge and have a respective equal portion of the voltage supply VHV applied at their electrodes. Specifically:

the first tank capacitance $C_1$ may have a voltage $V_1 = j \cdot VHV/(N-1) = 1 \cdot VHV/3$ with j=1 applied at its electrodes; and the second tank capacitance $C_2$ may have a voltage $V_2 = j^* VHV/(N-1) = 2 \cdot VHV/3$ with j=2 applied at its electrodes.

In the charge reuse driver system 10 as exemplified in FIGS. 1A-1D, the number of tank capacitances may be equal to N–2 where N is the number of sub-steps.

In the hypothesis of driving the capacitive load $C_1$ with a periodic signal, a j-th tank capacitance reaches a voltage level of $V_j = j \cdot VHV/(N-1)$ con j=1, 2, . . . , N–2.

FIGS. 1A-1D are exemplary of producing across the load capacitance $C_L$ a "trapezoidal" voltage signal having rising edges (from ground GND to VHV) and falling edges (form VHV to ground GND).

Specifically, a "rightward" sequence from FIG. 1A to 1D is exemplary of a rising edge while a "leftward" sequence from FIG. 1D to FIG. 1A is exemplary of a falling edge.

Providing a rising edge may comprise coupling the charge node of the load capacitance as exemplified in FIGS. 1A-1D going from FIG. 1A to FIG. 1D.

As shown in FIG. 1A, in a first sequence stage, the charge reuse driver 10 may close (e.g., turning on) solely the first switch 200, while maintaining open the remaining switches 201, 202, 20N in the set of switches (e.g., turned off). Accordingly, in the first stage as exemplified in FIG. 1A, the load capacitance $C_L$ may be coupled to the ground node GND, e.g., maintaining the load capacitance $C_L$ discharged.

As shown in FIG. 1B, in a second sequence stage the charge reuse driver 10 may close (e.g., turning on) solely the second switch 201, while maintaining open the remaining switches 200, 202, 20N in the set of switches (e.g., turned off). Accordingly, in the second stage as exemplified in FIG. 1B, the charge node 101 first storage capacitance $C_1$ may be coupled to the charge node 104 of the load capacitance $C_L$.

It is noted that tank capacitances $C_1$, $C_2$, in general, may have higher capacitance values than capacitance values of the load $C_L$ to be driven, e.g., $C_1 \gg C_L$, $C_2 \gg C_L$.

In one or more embodiments, in a generic j-th stage, e.g., during the rising edge or the falling edge, when the load capacitance $C_L$ is selectively coupled to the respective j-th tank capacitance, e.g., on the first tank capacitance $C_1$ when the second switch 201 is closed, a charge redistribution process may start.

As mentioned, as in general the tank capacitance $C_1$ may have a bigger value than the load capacitance $C_L$, the voltage drop across the load $V_L$ may reach approximately the same value of the voltage drop across the respective tank capacitance $C_1$. In one or more embodiments, the load capacitance $C_L$ may partially receive charge from or give charge to the tank capacitance $C_1$ as a function of whether coupling is performed while in the rising or falling edge of the ordered sequence, respectively.

It is noted that as a result of the charging/discharging process, in one or more embodiments voltage across the tank capacitance $C_1$ may be treated as unvaried, e.g., having a like value as a result of the process asymptotically tending to an exchange of similar charge quantities in periodic operation of the driver and of mentioned capacitances ratios $C_1/C_L \gg 1$.

As shown in FIG. 1C, in a third sequence stage the charge reuse driver 10 may close (e.g., turning on) solely the third switch 202, while maintaining open the remaining switches 200, 201, 20N in the set of switches (e.g., turned off). Accordingly, in the third stage as exemplified in FIG. 1C, the charge node 102 of the second storage capacitance $C_2$ may be coupled to the charge node 104 of the load capacitance $C_L$.

Again, similarly to what has been discussed in the foregoing with respect to FIG. 1B, when the load capacitance $C_L$ is selectively coupled to the respective tank capacitance, e.g., on the second tank capacitance $C_2$ when the third switch 202 is closed, a charge redistribution process may start.

As shown in FIG. 1D, in a fourth sequence stage the charge reuse driver 10 may close (e.g., turning on) solely the fourth switch 20N, while maintaining open the remaining switches 200, 201, 202 in the set of switches (e.g., turned off). Accordingly, in the fourth stage as exemplified in FIG. 1C, the voltage supply node VHV may be coupled to the charge node 104 of the load capacitance $C_L$. Consequently, a process of charging the load capacitance $C_L$ may begin. At the end of the charging process, the voltage $V_L$ present at the load capacitance $C_L$ may be equal to the supply voltage VHV, e.g., $V_L$=VHV for N=4.

It will be noted that the sequence stages of FIGS. 1A, 1B, 1C, and 1D may be performed in a different order with respect to the order discussed in the foregoing, e.g., beginning with the load capacitor $C_L$ charged up and moving "backwards" from FIG. 1D to FIG. 1A.

For instance, for a periodic input signal, the sequence may be self-sustaining, performing operations periodically oscillating from the first stage (FIG. 1A) to the fourth stage (FIG. 1D) and from the fourth stage (FIG. 1D) to first stage (FIG. 1A).

In one or more embodiments, the periodic driving sequence may reach a "stationary" condition for what concern the charge stored into the tank capacitors. For instance, at one sub-step on the falling edge the charge "lost" in the previous rising edge period may be "recovered."

In one or more embodiments, a stationary condition may be reached in which tank capacitances have a "constant" (e.g., neglecting second order effects, leakage or charge injections resulting from switching) voltage across. Such a stationary condition may result from operating the charge reuse so that: at an i-th step, the load capacitance $C_L$ receives a discrete charge quantity from a respective tank capacitance $C_1$, and at the j-th step, where j is a step involving a same tank capacitance $C_1$ but on the opposite falling edge of the previous i-th step, e.g., when j=N+1+I, the tank $C_1$ receives from the load $C_L$ a same discrete charge quantity to the one that was earlier (at i-th stage) transferred to the load $C_L$. As a result, the voltage value across the load $V_L$ varies periodically employing an exchange of a same discrete charge quantity (hence the name "charge reuse"). The step of the process in which the load is coupled to ground GND is different in that a fraction of charge, e.g., 1/(N−1)*Q, is lost to ground. Such a fraction may be indicated as representative of the efficiency of the system as it may be indicated to represent the energy effectively lost (not reused) in the charge reuse driver.

In one or more embodiments, driving a load capacitance $C_L$ according to embodiments may improve the power consumption, e.g., reducing it by a power reduction factor (N−1), where N is the number of sub-steps.

In one or more embodiments, such improved power consumption may derive from continuously exchanging charge between load and tank, hence charge may be lost when the load is discharged onto the ground node, where the "consumed" power P may be expressed as: $P = C_L * f * V_L^2 = C_L * f * VHV^2 / (N-1) = P_0/(N-1)$, where $P_0$ which may be expressed as $P0 = C_L * f * VHV^2$ is the power consumption without intermediate sub-steps between voltage supply and ground.

In one or more embodiments, increasing the number of steps N facilitates increasing the power reduction factor (N−1). For a given time-duration of the period of the periodic driving signal, e.g., trapezoidal driving signal $V_L$ comprising rising and falling edges, when the number of intermediate sub-steps is increased, so the time available for charge redistribution between tank and load capacitances $C_L$ is reduced. For instance, the time allocated for charge/discharge of the drive signal $V_L$ may be one tenth of the period of the driving signal.

At the same time, in general, in order to get full benefits from the charge reuse approach, the charge redistribution process in each sub-step may require a certain number of time-constants, where a time constant τ is a function of tank and load capacitances value and of the resistance of the switching circuits in the set of switches 200, 201, 202, 20N. Hence, reducing the switch circuit conductive resistance may be advantageous to facilitate power reduction.

Conventional switches, such as a switch 30 discussed in the following with respect to FIG. 3, may lack the adequate switch time and resistance $r_{ON}$. In order to decrease the resistance $r_{ON}$, such switches may reach significantly big sizes, leading to an increase in a parasitic capacitance $C_P'$ at the control terminals of transistors $T_1$, $T_2$ which may be employed. Consequently, switch startup time may increase, due to a bigger parasitic capacitance $C_P'$ taking longer time to be charged before enabling the turn on of the switch 30.

Hence, conventional switches may eventually reach a low on-resistance at the cost of an increase in turn-on time, making it difficult to adequately reach the desired reduction of time for charge redistribution in a j-th sub-step 201, 202.

Similarly, increasing the value of the startup current provided by generators $I_{E1}$ e $I_{B2}$ to fasten charging a bigger capacitance may lead to an undesired increased in power consumption and to a (possible) excess of $V_{GS}$ with consequent issues to remain in a SOA (Safe Operating Area) for the switch transistors. The limited $r_{ON}$, not negligible driving capacitances and SOA constraints of high voltage devices may limit the turn-on transient time and final DC resistance.

One or more embodiments may employ high-voltage devices as the voltages involved VHV, $V_L$ in the stages of the sequence FIG. 1A, FIG. 1B, FIG. 1C, FIG. 1D may reach high values, e.g., VHV=40 V.

Figure 2:
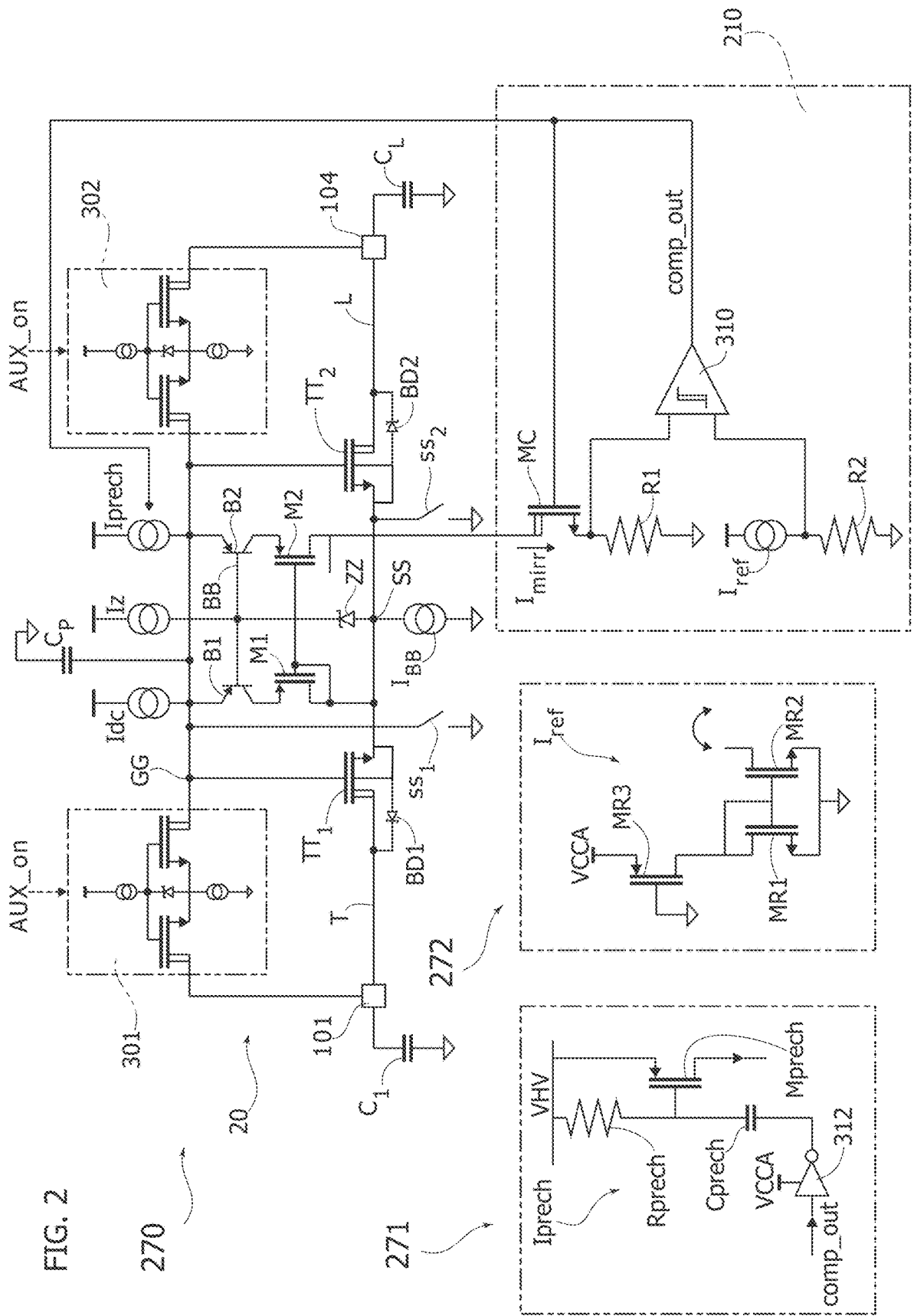
FIG. 2 is exemplary of a circuit as per the present disclosure.

FIG. 2 is exemplary of embodiments of a circuit 20, e.g., a high voltage (VHV=40 V) switch circuit, which may be used in the set of switches 200, 201, 202, 20N.

For the sake of simplicity, principles underlying embodiments will be discussed in the following with reference to the circuit 20 in a configuration as it may be found in the second switch circuit 201, configured to selectively couple the first storage capacitance $C_1$ to the load capacitance $C_L$. It will be noted that an i-th storage capacitance may be employed in the place of the first storage capacitance $C_1$ in the respective i-th switch, with i=1, ..., N−1.

In one or more embodiment as exemplified in circuit 270 of FIG. 2, the circuit 20 may comprise a switched current path, for instance through control terminals T, L in a pair of transistors $TT_1$, $TT_2$. In one or more embodiments, the pair of transistors $TT_1$, $TT_2$ may have respective control terminals coupled to:

a first common node SS, for instance a common source node, and a second common node GG, for instance a common gate node.

In one or more embodiments, the first transistor $TT_1$ may have a control terminal T in the switched current path, e.g., a drain terminal, coupled to the first storage "tank" capacitance $C_1$ while the second transistor $TT_2$ may have a control terminal L in the switched current path, e.g., a drain terminal, coupled to the load capacitance $C_L$.

In one or more embodiments, the pair of transistors $TT_1$, $TT_2$ may comprise a pair of High Voltage n-type transistors with proper voltage class.

In one or more embodiments, transistors in the pair of transistors $TT_1$, $TT_2$ may have respective parasitic capacitances $C_P$ at their control terminal and respective body-drain diodes BD1, BD2.

In one or more embodiments:

a first pull-down switch ss, (e.g., an electronic pull-down switch, such as a MOSFET transistor) may be configured to selectively couple the second common node GG to ground GND, a second pull-down switch 552 (e.g., an electronic pull-down switch, such as a MOSFET transistor) may be configured to couple the first common node SS to ground GND.

In one or more embodiments, a bias current generator $I_{BB}$ may be coupled to the first common node SS.

In one or more embodiments, the circuit 20 may comprise auxiliary switches 301, 302, configured to be operated from a controller, wherein:

the first auxiliary switch 301 may be coupled between the second common node GG and the control terminal T of the first transistor $TT_1$; and the second auxiliary switch 302 may be coupled between the second common node GG and the control terminal L of the second transistor $TT_2$.

In one or more embodiments, auxiliary switches 301, 302 may comprise a circuit 30, as discussed in the following with respect to FIG. 3.

In one or more embodiments, the switch circuit 20 may comprise a current mirror arrangement B1, B2, M1, M2 of transistors, which may be operated as discussed in the following.

For instance, the current mirror arrangement B1, B2, M1, M2 may comprise:

a first subset of transistors B1, B2 (e.g., a pair of p-type bipolar transistors); and a second subset of transistors M1, M2 (e.g., a pair of p-type high voltage transistors).

In one or more embodiments, the first subset of transistors B1, B2 may have their terminals, e.g., base terminals for bipolar transistors B1, B2, coupled to an intermediate node BB, e.g., a common base.

In one or more embodiments, the second sub-set of transistors M1, M2 may each be coupled, e.g., in series, to respective transistors B1, B2 in the first set of transistors, while at the same time having one of their respective control terminals coupled to a common node, e.g., a common gate.

One or more embodiments may comprise a diode ZZ, e.g., a Zener diode, that may be coupled between the intermediate node BB and the first common node SS in order to:

protect the voltage drop of the transistors $TT_1$, $TT_2$ from breakdown, e.g., respective gate-source voltage drops $V_{GS}$; and provide, in addition to a voltage $V_{BE}$ across the transistors B1 and B2, at the same time, a proper value of voltage drop, e.g., above the threshold value, in order to turn-on the transistors $TT_1$, $TT_2$.

In one or more embodiments, the circuit 20 may comprise a set of current generators Idc, Iz, Iprech.

In one or more embodiments, the set of current generators Idc, Iz, Iprech may comprise:

a first current generator Idc, which may be coupled to a control terminal, e.g., emitter node, of transistors B1 and B2;

a second current generator Iz, which may be coupled to a control node of transistors B1 and B2 (e.g., in a common base configuration) and to, e.g., the negative terminal (cathode), of the diode ZZ; and a third current generator Iprech, which may be coupled to a control terminal, e.g., emitter node, of transistors B1 and B2.

In one or more embodiments, the current mirror arrangement B1, B2, M1, M2 may have its output terminal, e.g., drain terminal of transistor M2, coupled to a control circuit 210, comprising:

a transistor MC (e.g., a high voltage n-type transistor), having its output terminal, e.g., its drain terminal, coupled to the respective output terminal M2 of the current mirror arrangement B1, B2, M1, M2;

a resistor R1 coupled to the source terminal of the transistor MC;

a reference current generator $I_{ref}$, coupled to a second resistor R2; and a comparator 310, coupled to the first and second resistors R1, R2 and configured to provide as output a trigger signal comp_out indicative of the comparison of respective voltage drops across respective first and second resistors R1, R2.

In one or more embodiments, a control terminal of the transistor MC may be coupled to an output node of the comparator 310.

In one or more embodiments, the control terminal of the transistor MC may be coupled to the output node of the comparator 310 via a digital conditioning circuit block (not visible in FIG. 2). For instance, the digital conditioning circuit block may be configured to initialize trigger signal comp_out at an initial stage, e.g., comp_out="0," forcing the signal to go to this value in a phase in which the switch stage may not be defined. In the example considered, the trigger signal comp_out value may result from other logic circuits operating it, e.g., via the digital conditioning circuit block.

In one or more embodiments, the trigger signal comp_out provided as output from the comparator may be used as control signal to operate a current generator in the set of generators Idc, Iz, Iprech, for instance to operate specifically the third current generator Iprech.

Circuit 272 of FIG. 2 is exemplary of one or more embodiments of the reference current generator $I_{ref}$ which may comprise a current generating arrangement of transistors MR1, MR2, MR3. For instance, a first transistor MR3 (e.g., a p-type high voltage transistor) may have a control terminal (e.g., its source terminal) coupled to a bias voltage supply VCCA and another control terminal (e.g., its drain terminal) coupled to a pair of transistors MR1, MR2 (e.g., a pair of n-type transistors) configured as a current mirror, providing as output the reference current $I_{ref}$. It is noted that the double arrow hovering on a terminal of the transistor MR2 in the pair of transistors in circuit 272 of FIG. 2 indicates that the current $I_{ref}$ provided by the exemplary circuit of circuit 272 of FIG. 2 may have a direction opposite to the direction of the current flowing in the circuit as a result of operating the current generator $I_{ref}$.

Circuit 271 of FIG. 2 is exemplary of one or more embodiments of a third current generator circuit Iprech and of the control circuit to operate it as a function of the signal comp_out provided by comparator 310.

In one or more embodiments the third current generator circuit Iprech may have an inverter 312. For instance, the inverter 312 may be coupled to a capacitor Cprech, coupled to a resistor Rprech, e.g., in series, coupled to a transistor Mprech (e.g., a p-type high voltage transistor). In one or more embodiments, the inverter 312 may be applied to control terminals of the transistor Mprech, configured to receive the trigger signal comp_out from comparator 310.

In one or more embodiments the transistor Mprech may have its source terminal coupled to a high voltage level VHV at, e.g., bias high voltage level, also coupled to the resistor Rprech.

In the exemplary implementation of circuit 271 of FIG. 2, the resistance Rprech, the capacitor Cprech and the inverter 312 may be in a level-shifter arrangement, to facilitate applying the bias voltage supply VCCA to the terminals (gate to source $V_{GS}$ voltage) of the transistor Mprech.

In one or more embodiments, the transistor Mprech in the pre-charge generator and the transistor MR3 in the reference generator may have sizes proportional one to another, so as to generate a correlation between the current values provided by respective generators.

It is noted that other current generator architectures may be employed to realize the reference current generator $I_{ref}$ and the pre-charge current generator Iprech discussed in the foregoing, in ways per se known.

Figure 3:
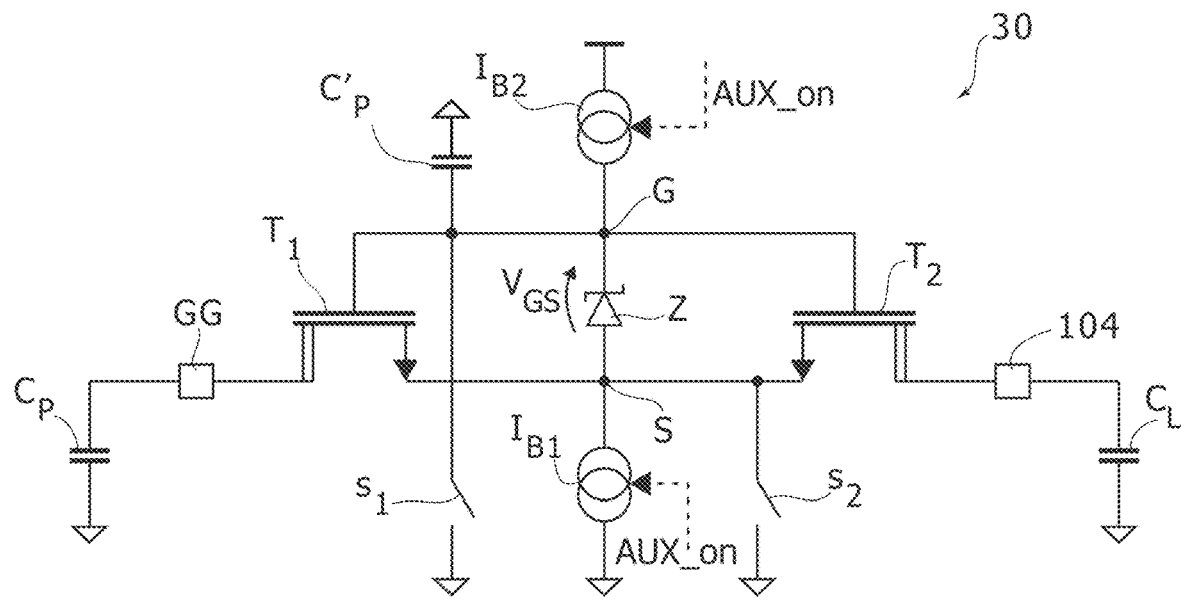
FIG. 3 is exemplary of an auxiliary switch circuit embodiment.

FIG. 3 is exemplary of a (per se conventional) auxiliary switch circuit 30, which may be employed in the auxiliary switches 301, 302 in the circuit 20.

In one or more embodiments, the auxiliary switch 30 may comprise a pair of transistors $T_1$, $T_2$, e.g., a pair of High Voltage n-type transistors with proper voltage class, which may have respective control terminals coupled:
  to a first common node, e.g., a common source node S; and
  to a second common node, e.g., a common gate node G.

In one or more embodiments, a diode Z, e.g., a Zener diode, may be coupled between the first common node S second common node G, in order to protect the voltage drop of the transistors $T_1$, $T_2$ from breakdown and provide a proper value of voltage drop value.

In one or more embodiments, a first current generator $I_{B1}$ may be coupled between the first common node S and ground GND, while a second current generator $I_{B2}$ may be coupled between high-voltage supply and the second common node G.

In one or more embodiments:
  a first pull-down switch s, (e.g., an electronic pull-down switch, such as a MOSFET transistor) may be coupled between the second common node G and ground GND; and
  a second pull-down switch 52 (e.g., an electronic pull-down switch, such as a MOSFET transistor) may be coupled between the first common node S and ground GND.

In one or more embodiments, the first output terminal, e.g., a drain terminal, of the first transistor $T_1$ may be coupled to the common node GG of $TF_1$ and $TT_2$, modeled as a parasitic capacitance $C_P$ while a second output terminal, e.g., a drain terminal, of the second transistor $T_2$ may be coupled to the charge node 104 of the load capacitance $C_L$.

For the sake of simplicity, the auxiliary circuit 30 will be discussed in the following as having a configuration like the configuration of the second auxiliary switch 302, being otherwise understood that such a configuration is not limiting. As such an auxiliary switch circuit 30 may be employed in other configurations. For instance, in one or more embodiments it may be coupled to a respective i-th tank capacitance charge node 101, 102, with i=1, ..., N–1, (e.g., when used in a configuration as in the first auxiliary switch 301) and to a parasitic capacitance $C_P$ of any of the first and second transistors $TF_1$, $TT_2$ of the circuit 20 via the second common node GG.

In one or more embodiments, when the switch 30 is in a first stage, e.g., "on" or "active," a current path couples the load capacitance $C_L$ and the parasitic capacitance $C_P$.

In one or more embodiments, current paths across transistors $T_1$, $T_2$ in the auxiliary switch circuit 30 may be made conductive as a result of current generation in the first and/or second current generators $I_{B1}$ and $I_{B2}$. For instance, a controller may operate the current generators as a function of a signal AUX_on.

For instance, when both first S and second G common nodes are short circuited to ground GND via switches $s_1$, $s_2$, the auxiliary switch 30 is "off."

Conversely, when pull-down switches $s_1$, $s_2$ are switched-off (e.g., being open) and current generators $I_{B1}$ and $I_{B2}$ are turned-on (e.g., providing respective currents), the auxiliary switch 30 is turned-on.

In one or more embodiments the auxiliary switches 301, 302 may be "small" with respect to the circuit 20, in order to quickly pre-charge the second common node GG of the transistors $TT_1$, $TT_2$, e.g., thanks to an equivalent low impedance provided by the "big" tank and load capacitances $C_1$, $C_L$. For instance, auxiliary switches 301, 302 may be sized so as to keep the transient time to charge-up the gate (e.g., its parasitic capacitance $C_P$ of $TT_1$ and $TT_2$) adequately short. In one or more embodiments, the adequate sizing may facilitate increasing the number of steps in the charge reuse driver.

It is noted that, in order to facilitate speeding up the switch turn-on stage, the bias current value provided by the current generators $I_{B1}$ and $I_{B2}$ may be increased. For instance, as soon as one or more parasitic capacitances $C_P$ are charged up, the bias current $I_{B1}$ and $I_{B2}$ may flow in the Zener diode Z.

Figure 4:
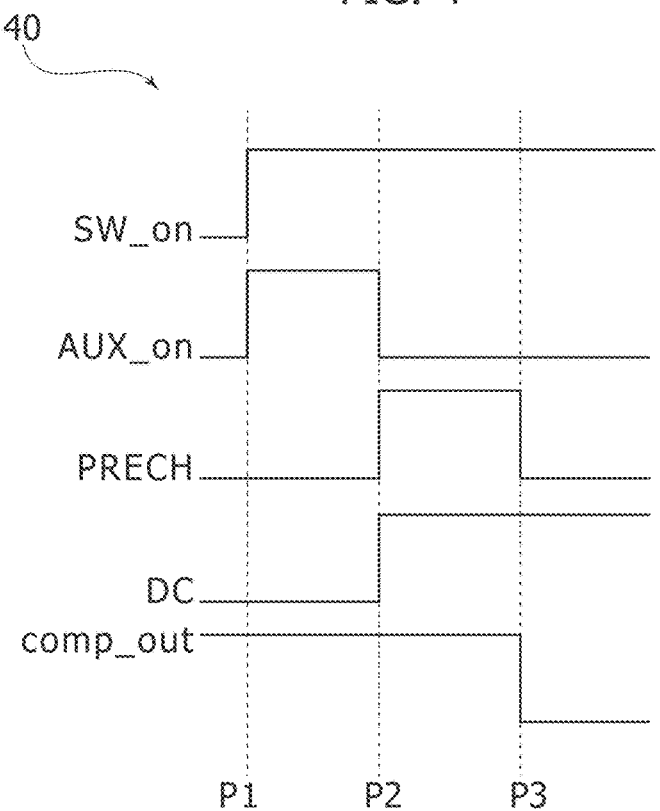
FIG. 4 is exemplary of time diagrams of signals as discussed in the present disclosure.

FIG. 4 is exemplary of time diagrams of a set of pre-charge signals 40 which may be employed, e.g., provided by a controller or within the circuit, to operate the circuit 20.

It is noted that one or more embodiments may involve finding out a proper sizing against process, temperature and supplies variations.

In one or more embodiments, a start-up signal SW_on having a first value, e.g., SW_on="1," may be provided to the switch circuit 30, initiating a first stage P1, e.g., a pre-charge stage. During this first stage starting at P1, for instance:

the circuit 20 is not active (e.g., not driven in current $I_{BB}$, Idc, Iz, Iprech); and at least one of the auxiliary switches 301, 302 is active (e.g., turned on), coupling the second common node GG of the pair of transistors $TT_1$, $TT_2$ to either one of the tank $C_1$ and load $C_L$ capacitances, respectively.

Specifically, a start-up signal SW_on provided in the first stage P1 may turn on solely the auxiliary switch in the auxiliary switches 301, 302 which is coupled to the charge node showing the lower voltage drop between tank and load terminals respective charge nodes 102, 104. For instance, such a selection may take place as a function of whether the first stage P1 belongs to the rising or falling edge of the driving signal $V_L$.

In one or more embodiments, the pre-charge phase 40 may have a limited time duration, which facilitates reducing power consumption P as well as a fast turn on of the switch 20.

In one or more embodiments, before the start-up signal SW_on is provided, the voltage drop at the second common node GG may be at ground level, e.g., as a consequence of a reset signal being provided.

In one or more embodiments, such a transient time in which pre-charge may be performed by the auxiliary switches 301, 302 may be provided by a correlated monostable, generating a signal AUX_on having a limited time duration. For instance, the signal AUX_on may be used to activate either one of 301, 302 for such limited time.

In one or more embodiments, during the time in which at least one auxiliary switch 301, 302 is on (e.g., between phase P1 and P2, while the signal AUX_on has a first value AUX_on="1"), the voltage drop on the second common node GG starts quickly to rise up from ground, e.g., up to the value of the voltage drop across either one of tank $C_T$ or load $C_L$, as a function of the charge node terminal (102 or 104) at which the auxiliary switch 301, 302 which is active is coupled. Subsequently, when the signal AUX_ON has a second value, e.g., "0," as a result of the end of the limited time duration, e.g., at P2, the first phase P1-P2 ends.

Figure 5:
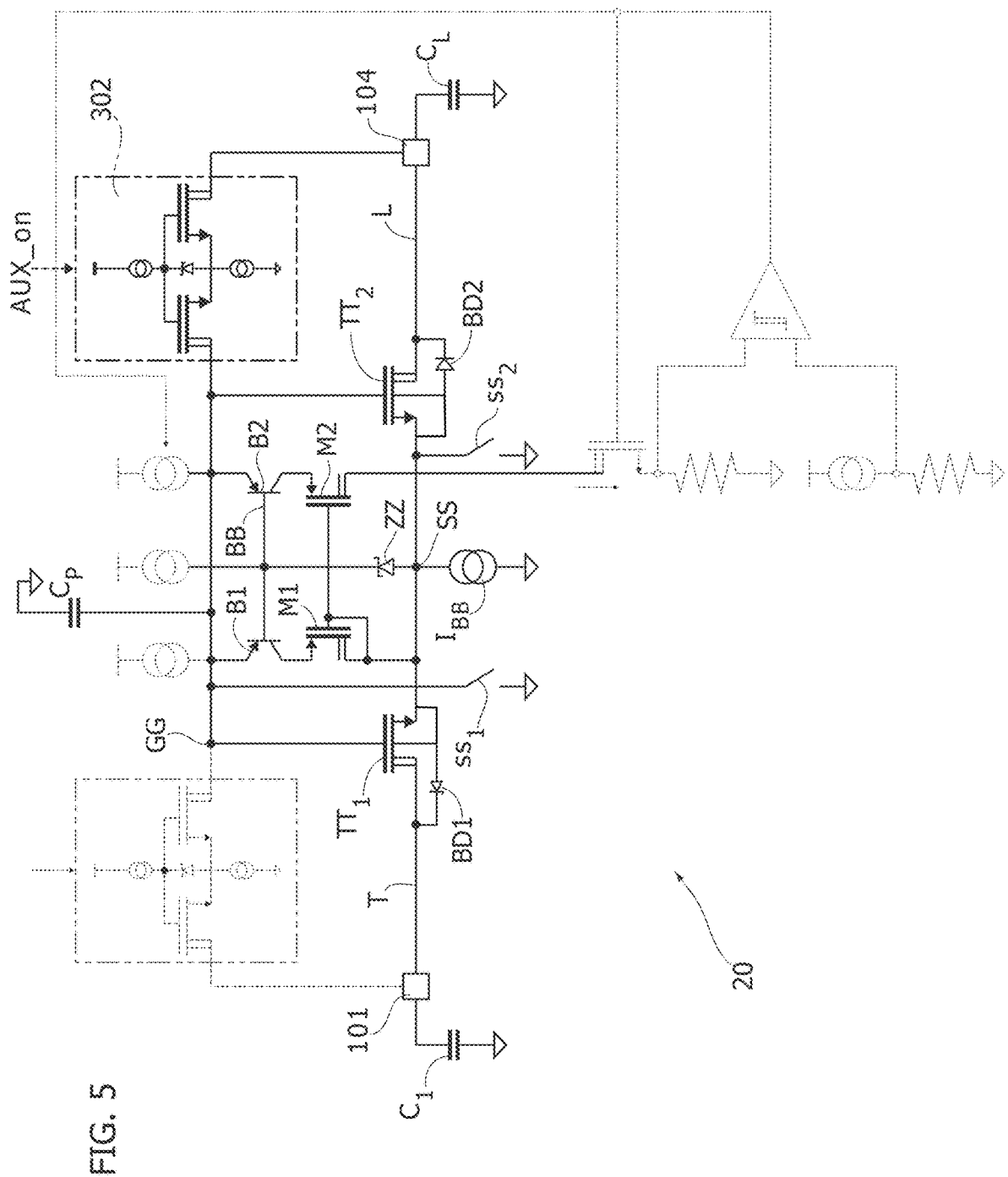
FIGS. 5 and 6 are exemplary of portions of the exemplary circuit of FIG. 3.
Figure 6:
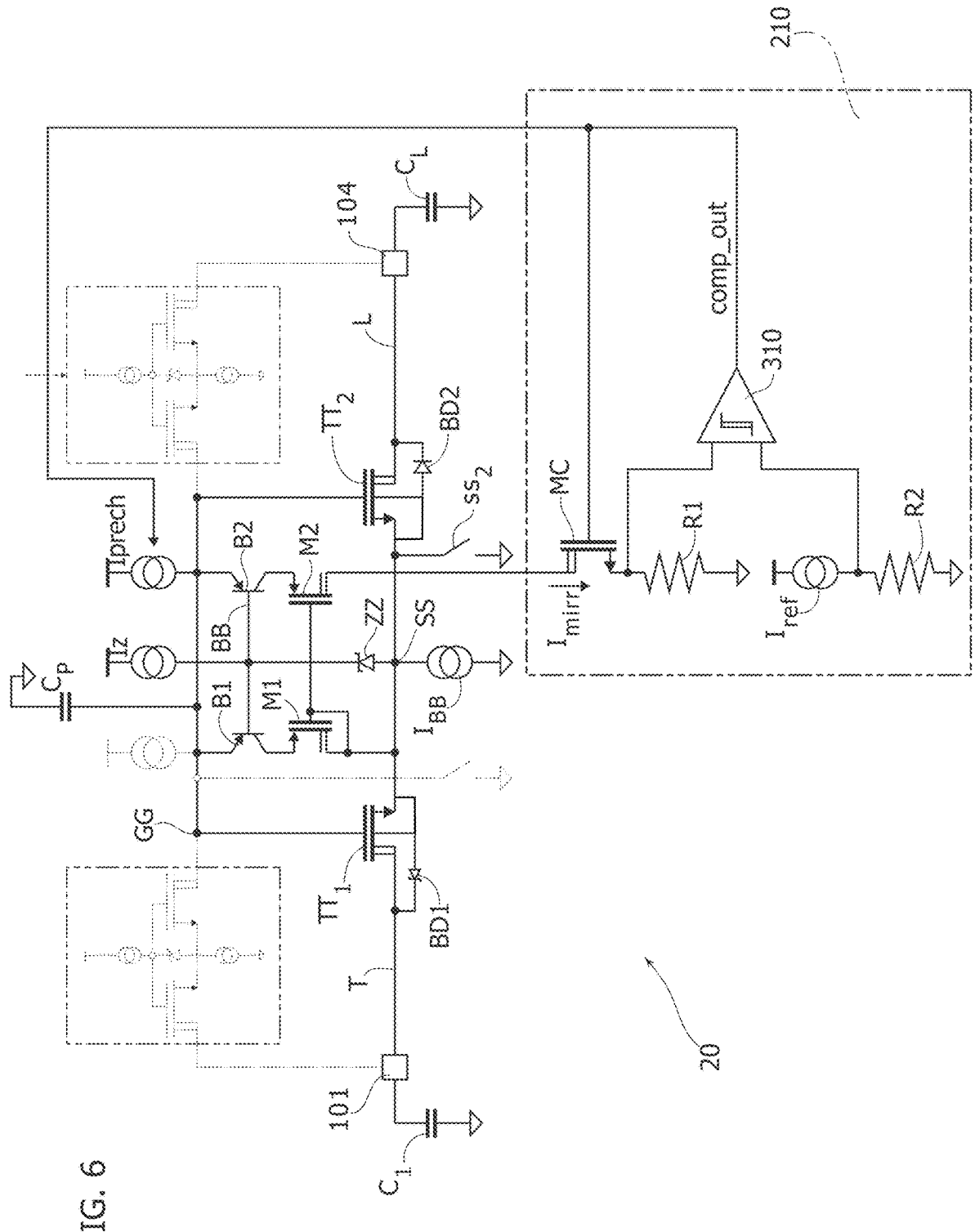

FIGS. 5 and 6 are exemplary of possible operation of embodiment as per the present disclosure. In order to facilitate understanding of operation as exemplified, certain portions of FIGS. 5 and 6 are shown in phantom line to indicate circuit portions which may not be active in a certain operational state.

FIG. 5 shows an example of switch circuit 20 during the first stage in the interval P1-P2, e.g., as a result of signal levels as discussed in the foregoing.

For the sake of brevity, like reference numerals/symbols are used in FIG. 5 and FIG. 2 to indicate like circuit portions.

For instance, during the first stage P1-P2, as shown by the dashed arrows in FIG. 5, if the load capacitance $C_L$ stores a voltage lower than the voltage stored on the tank capacitor $C_1$ (as e.g., in the case discussed with respect to FIG. 1B, where the tank capacitor is already indicated as $C_1$), then the auxiliary switch 302 is activated.

In one or more embodiments, the parasitic capacitance $C_P$ of the common control terminal GG may be pre-charged 40, e.g., quickly, via the respective auxiliary switch 302, e.g., as a function of the low impedance of respective load/tank capacitance.

In the example considered, while the parasitic capacitance $C_P$ charging process is ongoing, voltage level at the common control terminal GG may increase consequently, and a portion of the current may begin to flow into the current mirror arrangement transistors B1, B2, M1, M2 and the Zener diode ZZ towards the second common control terminal SS. Voltage level at the second common control terminal SS may increase consequently, e.g., gradually. Hence, in the example considered, respective body diode junctions BD1, BD2 may be weakly turned-on.

In one or more embodiments, the body diodes BD1, BD2 may be turned on when the node SS exceeds voltage at nodes L and/or T. For instance, this may happen: during the pre-charge phase via the auxiliary switches 301, 302 when the auxiliary switch which has been turned on is coupled to the higher voltage between the voltages in tank $C_1$ and load $C_L$ or during the following pre-charge phases (when the Iprech current is activated and the GG and SS nodes can rise with respect to the higher voltage between the voltages in tank $C_1$ or load $C_L$).

In one or more embodiments, the pre-charge phase via auxiliary switches may advantageously involve activating the auxiliary switch which is coupled to the lower voltage between the voltages in tank $C_1$ and load $C_L$.

In one or more embodiments, it may also be possible to activate the auxiliary switch coupled to the higher voltage between the voltages in tank $C_1$ and load $C_L$ or activating both of the auxiliary switches.

At this point, a second stage between time P2 and P3 as shown in FIG. 4 may comprise signals 40 used in order to complete the turn-on of the switch circuit 20.

In one or more embodiments, at the beginning P2 of the second stage P2-P3, at least one current generator in the set of current generators Idc, Iz, Iprech may start driving the switch circuit 20 in current, in order to:

complete the charging of its common gate GG above the maximum voltage between load 104 and tank 101 respective nodes; and provide a proper voltage drop $V_{GS}$ between first SS and second GG common nodes.

In one or more embodiments, a signal PRECH may have a first value "1" between phase P2 and P3 in order to switch on the current generators Iprech and Iz to provide:

a pre-charge current Iprech from the third pre-charge generator Iprech, e.g., non-negligible, to fast complete the charging of the common node GG of the switch circuit 20; and a diode current Iz from the diode current generator Iz, e.g., small, to keep a voltage of 2-3V across the Zener diode ZZ.

In one or more embodiments, at the beginning of the second stage P2-P3:

AUX_on may go to or remain in a second state, e.g., AUX_on="0" and the auxiliary switch 302 may be deactivated; and the majority of the pre-charge current Iprech from the third generator flows to charge the parasitic capacitance $C_P$, e.g., of the second transistors $TT_1$ and $TT_2$ as discussed in the example of FIG. 5.

In one or more embodiments, as soon as the parasitic capacitance $C_P$ may have a charge close to its final value, e.g., maximum value, an increasing portion of the pre-charge current Iprech may begin to flow in the transistors B1 and B2 arranged as a current mirror pair.

In one or more embodiments, transistor B2 may mirror a current proportional or equal to the current flowing in B1, provided by the pre-charge current generator Iprech.

For instance, while approaching the full charge of the parasitic capacitance, the current from the current generator Iprech flows less and less towards the parasitic capacitance $C_P$ and more and more towards the current mirror B1, B2, e.g., as a result of the mirroring ration among transistors B1, B2.

For instance, when at least a consistent portion of the pre-charge current Iprech flows through current mirror transistors B1 (and B2) and is closed onto load $C_L$ and/or tank capacitance $C_1$ via body diodes BD1 (and BD2) and transistors $TT_1$ (and $TT_2$) turned (partially) on, the pre-charge of the parasitic capacitance $C_P$ may be considered completed and the pre-charge current generator Iprech may be (opportunely) turned-off.

Hence, the current through transistor B2 may be a well-defined portion of the pre-charge current Iprech, as soon as the pre-charging 40 of parasitic capacitance $C_P$ has been completed. For instance, if B2 is equal to B1, then B2 brings half of the pre-charge Iprech.

In one or more embodiments, transistors M1 and M2, e.g., in series with transistor B1 and B2, form a cascode couple for B1 and B2, improving the mirroring among B1 and B2 transistors as well as facilitating to obtain a configuration within SOA constraints of B1 and B2 transistors. In one or more embodiments, the cascode transistors M1, M2 are high-voltage devices.

In one or more embodiments, thanks to current mirroring B1, B2, M1, M2, the mirrored current Imirr on B2 reaches the control circuit portion 210 of the switch circuit 30, where it is compared in the comparator 310 to a reference current $I_{ref}$, e.g., since the mirrored current Imirr flows through a resistor R1 and the reference current from reference current generator $I_{ref}$ flows in resistor R2, both of which are coupled to the input nodes of the comparator, sensitive to the voltage drops on the resistors R1, R2.

In one or more embodiments, current generators, as exemplified in circuits 271 and 272 of FIG. 2, may provide a correlation between reference and mirrored current values $I_{ref}$, Imirr, in order to facilitate comparing such values in the comparator.

In one or more embodiments, as a result, the resistors R1, R2 may be matched correspondingly.

For instance, the mirrored current Imirr may be a well-defined fraction of the pre-charge current Iprech, e.g., generated via the level shifter exemplified in circuit 271 of FIG. 2 by applying a voltage VCCA to the voltage $V_{GS}$ of the high-voltage transistor Mprech.

For instance, the reference current may be generated in the static circuit exemplified in circuit 272 of FIG. 2 by the transistor MR3, e.g., of the same type of the transistor Mprech opportunely sized to which a same voltage VCCA may be applied to the voltage drop $V_{GS}$.

As a result, in the example discussed, the current values of Iprech and $I_{ref}$ are correlated precisely, neglecting second order effects (e.g., manufacturing process spread, temperature, voltage supply, ripples . . . ) which may be fixed with methods per se known.

In one or more embodiments, the comparator 310 may provide a signal comp_out which, for instance:

has a first value, e.g., comp_out="1," if the mirrored current Imirr is lower than the reference current $I_{ref}$; and has a second value, e.g., comp_out="0," if the mirrored current Imirr equals or exceeds the reference current $I_{ref}$.

In one or more embodiments, the comparator 310 may provide the signal comp_out indicative of the status of charging of the parasitic capacitance $C_P$, e.g., being indicative that a portion of Iprech current which does not flow to charge the parasitic capacitance $C_P$ has reached a certain value.

In one or more embodiments, the signal comp_out may be used as a trigger signal to the pre-charge current generator Iprech, facilitating to define a, e.g., defined by design, pre-charge phase time duration. For instance, as in the example of FIG. 4, when comp_out changes value from "1" to "0," the signal PRECH as well switches from "1" to "0," indicating the end P3 of the second stage P2-P3 and operating the pre-charge generator Iprech to end generation of the current Iprech.

In one or more embodiments, as a function of the trigger signal comp_out, the pre-charge generator Iprech can be switched-off or strongly reduced, e.g., as a result of the majority of the pre-charge current Iprech mainly flowing on the current mirror transistors B1, B2, M1, M2.

In one or more embodiments, at the end P3 of the second phase P2-P3, the switch circuit 20 is hence in the condition to be completely active or "on".

In one or more embodiments, the parasitic capacitance $C_P$ may be pre-charged up to a pre-charge level, e.g., a function of a difference between the voltage at the tank node 101 and the voltage $V_L$ at said at least one charge node 104 of the load capacitance $C_L$.

In one or more embodiments, a Direct Current (DC) generator Idc may also be turned on, e.g., at the beginning of phase P2, in order to keep a DC condition to switch-on the switch circuit 20 after the pre-charge generator Iprech is turned off at the end of phase P3, as shown in FIG. 4.

In one or more embodiments, the signal comp_out from the comparator 310 may also, e.g., concurrently, cause the turns-off a branch B2 of the current mirror B1, B2, M1, M2.

FIG. 6 is exemplary of the switch circuit 20 status in the second stage P2-P3 of FIG. 4 and as discussed in the foregoing.

For the sake of brevity, like reference numerals/symbols are used in FIG. 3 and FIG. 6 to indicate same circuit portions.

In one or more embodiments, $I_{ref}$ may be defined through a matched circuit (e.g., as shown in circuit 272 of FIG. 2).

In one or more embodiments, the second stage P3 may end when the current in transistor B2 reaches a value equal to a defined ratio of the current Iprech.

For instance:

a best turn-on performance may end the phase P3 when the current in the current mirror B1, B2 has a ratio about 4/5 of the pre-charge current Iprech, e.g., Imirr=0.8*Iprech. The circuit 20 may reach very fast turn-on time (e.g., about 20-30 ns, where 1 ns=$10^{-9}$ s=1 nanosecond) associated to a low DC resistance (e.g., less than 25 Ohm).

In one or more embodiments, switching "off" the generator Iprech may comprise an exponential decay phase.

In one or more embodiments, switching between a first, e.g., consistent, pre-charge bias current, in order to speed up charging parasitic capacitances $C_P$, e.g., gate capacitance, and a second current, e.g., smaller, may be considered in order to maintain a proper and safe $V_{GS}$ for the rest of the transient charging phase.

It is noted that a switching circuit arrangement 20 as discussed in the foregoing may have an advantage to provide a robust SOA (Safety Operating Area) of the voltage drop $V_{GS}$ of transistors $TT_1$ and $TT_2$. For instance, such voltage drop $V_{GS}$ may be the sum of diode voltage drop across the diode ZZ and a threshold voltage drop $V_{BE}$.

In one or more embodiments, the current on Zener diode ZZ may be about $2/\beta$ of the pre-charge current Iprech, facilitating to size the current keeping a voltage drop across the diode ZZ adequately low, in order not to exceed SOA limits. For instance, sizing of the pre-charge current Iprech may take into account the diode Zener law, e.g., $V_Z=VZ(I_Z)$, so that the voltage across the Zener diode is kept at an adequately high value to guarantee the turn-on of $TT_1$, and $TT_2$ transistors (together with the $V_{BE}$ of B1 and B2) while being also kept at a value adequately low not to arise SOA issues.

As mentioned, in one or more embodiments, different ratios can be selected for components of different portions of the circuit (for instance, B1, B2, and/or R1, R2, . . . ) in order to save area and consumption.

In one or more embodiments, the switch circuit 20 may facilitate providing well controlled SOA constraints against process, temperature and supply variations.

Figure 7:
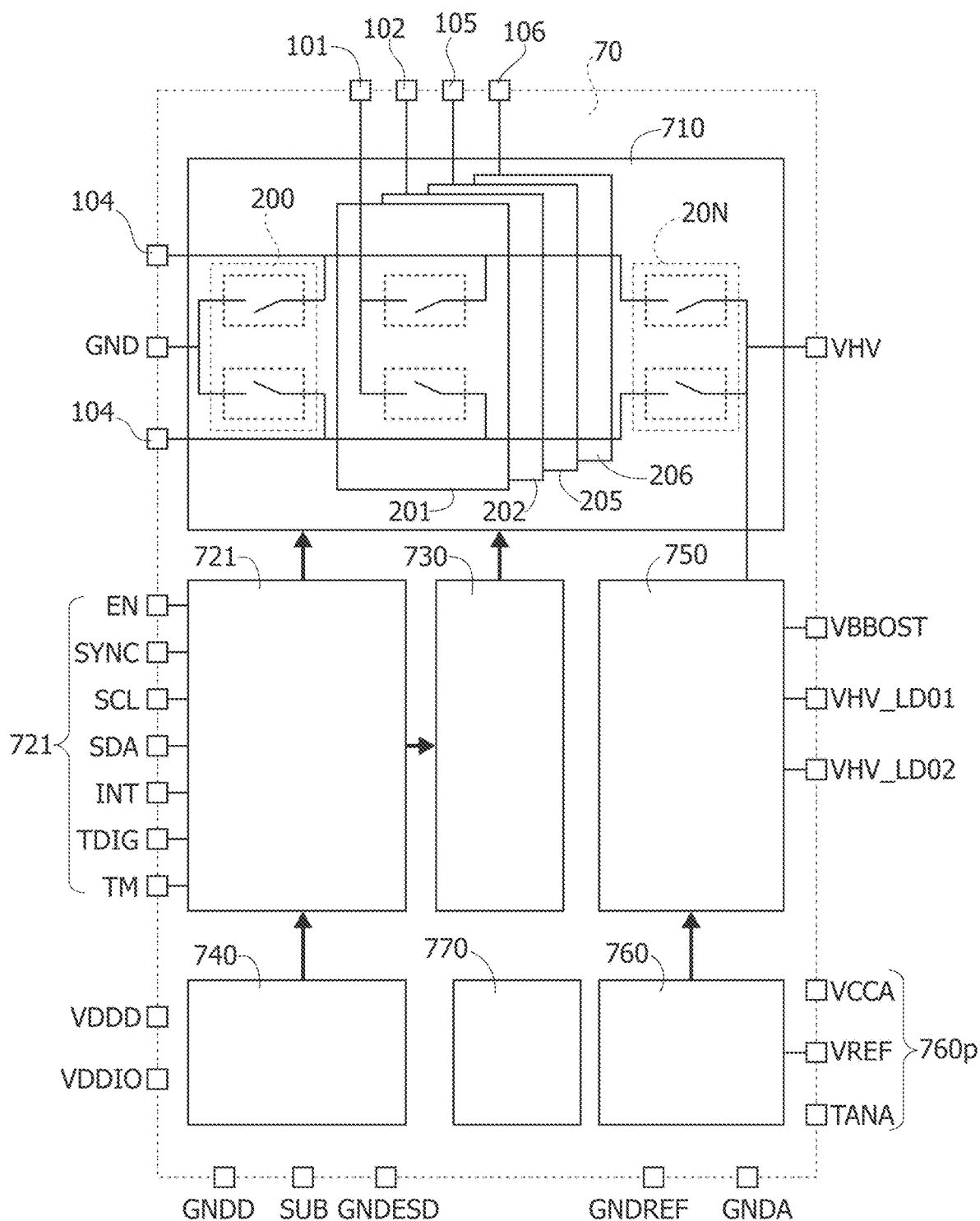
FIGS. 7 and 8 are exemplary of a piezoelectric driver device as per the present disclosure.
Figure 8:
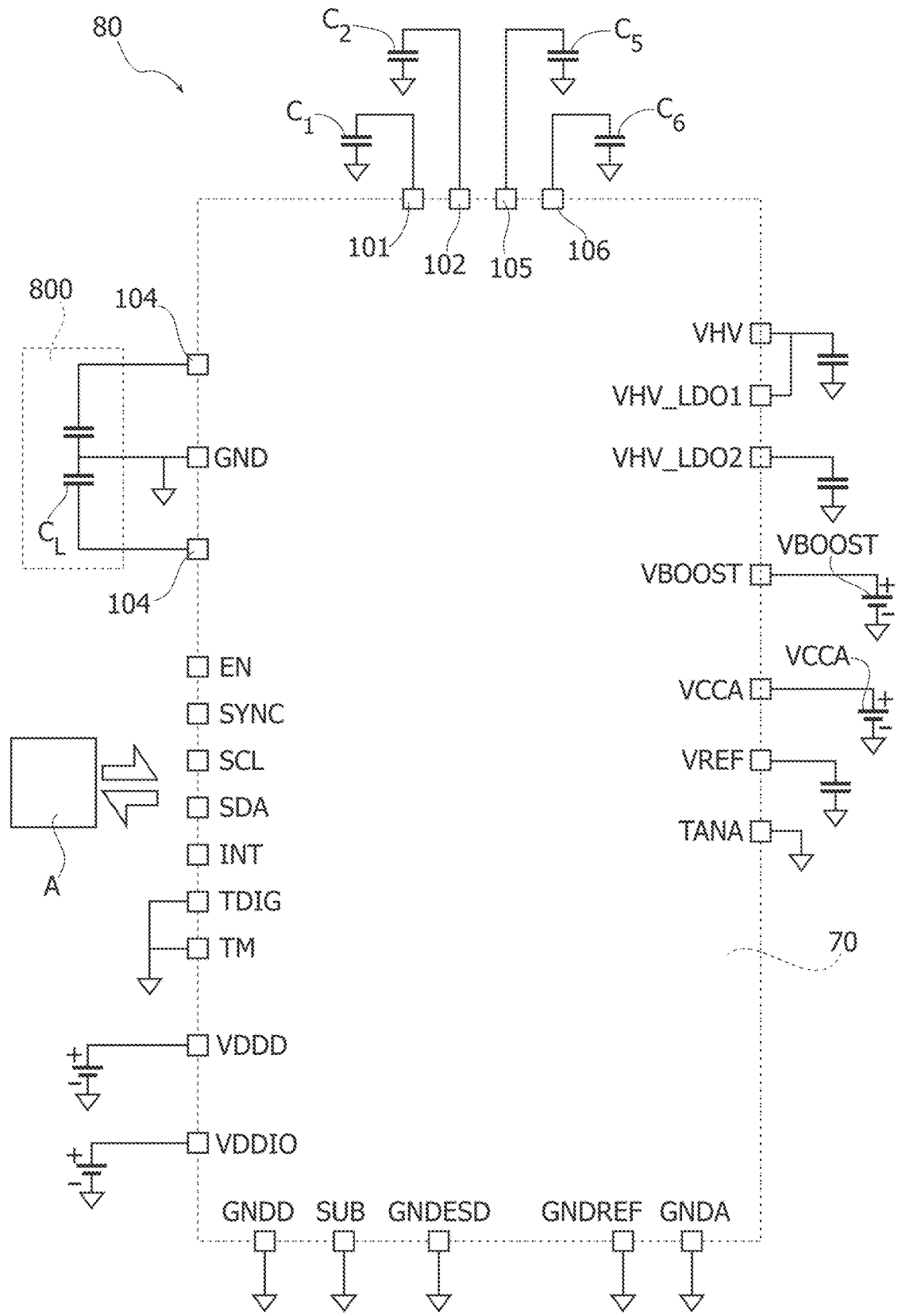

FIGS. 7 and 8 are exemplary of a circuit 70 and a device 80.

In an exemplary embodiment as shown in FIG. 7, a driver device 70 may comprise:

a charge reuse driver circuit block 710, comprising a set of switches 200, 201, 202, 205, 206, 20N, one or more of which may comprise a circuit 20 therein and be configured to be operated according to one or more embodiments, as discussed in the foregoing;

a logic circuit block 721, e.g., digital logic circuit block, which may comprise the control circuit portion 210 of the switch circuit 20;

a pre-store circuit block 730, an oscillator circuit block 740, e.g., a monostable circuit, which may provide a clock signal to the logic circuit block 730, e.g., for timing signals, providing a clock signal;

a low drop-out regulator (LDO) circuit block 750, providing bias supply voltages, e.g., high voltages; and a reference circuit block 760, e.g., bandgap circuits, providing the reference current $I_{ref}$ or a reference voltage.

In one or more embodiments, the pre-store circuit block 730 may comprise circuits, known per se, to pre-load the tank capacitors in order to speed up device start-up, e.g., pre-charging tank capacitors to provide a voltage drop at their ends approximately equal to the value of such voltage drop in stationary periodic driving operations.

In one or more embodiments, the logic circuit block 721 may be coupled to the oscillator circuit block 740, to the pre-store circuit block 730 and to the charge reuse driver circuit block 710 and may be configured to process and provide as output, e.g., timed, control signals to the charge reuse driver 710 and to the pre-store circuit block 730.

In one or more embodiments, the driver device may comprise a plurality of pins 721p, for instance facilitating to customize the configuration of the logic circuit block 721.

In one or more embodiments, the pre-store circuit block 730 may be coupled to the charge reuse driver 710, specifically to the set of switches 200, 201, 202, 206, 20N in the charge reuse driver 710.

In one or more embodiments, the reference circuit block 760 may be coupled to the low drop-out regulator (LDO) circuit block 750, for instance providing reference voltage and current values, in a way per se known.

In one or more embodiments, the reference circuit block 760 may provide a set of pins 760p facilitating configuration.

In one or more embodiments, the LDO circuit block 750 may provide a stable high voltage supply VHV to the charge reuse driver circuit block 710, for instance as a function of the reference voltages and currents received.

In one or more embodiments, a boost node VBOOST may be coupled to the LDO circuit block 750 and may be suitable for providing a boost bias voltage the LDO circuit block 750 in order to provide a regulated voltage level VHV. For instance, such a boost bias voltage may be provided externally, and coupled via the boost node VBOOST, or it may be generated internally, e.g., via a DC-DC converter (also called boost converter) as a function of a low-voltage bias.

In one or more embodiments, a node VHV may facilitate providing the voltage supply VHV from an external source via the pin VHV.

In one or more embodiments, the charge reuse driver circuit block 710 may comprise a set of respective charge node pins 101, 101, 105, 106 to which a set of storage tank capacitances $C_1$, $C_2$, $C_5$, $C_6$ may be coupled.

In one or more embodiments, the charge reuse driver circuit block 710 may provide at least one charge node 104 configured to be coupled to a capacitive load, e.g., a micromirror.

In one or more embodiments, the driver device 70 may comprise ground pins, e.g., one or more for circuit blocks, identified by the first three letters being GND.

As shown in the exemplary embodiment of FIG. 8, the driver device 70 may form a device assembly 80 comprising:

a plurality of tank capacitors $C_1$, $C_2$, $C_5$, $C_6$, e.g., coupled, e.g., soldered, to respective charge node pins 101, 102, 105, 106;

at least one capacitive load $C_L$, for instance of a piezoelectric actuator 800, coupled to the respective at least one charge node 104 of the charge reuse driver circuit block 710 in the driver device 70;

an interface A, e.g., a digital interface;

optional capacitances, e.g., coupled to respective pins indicated as VREF, VHV_LDO, VHV;

a set of voltage sources, e.g., coupled to respective pins $V_{CCA}$, $V_{BOOST}$ in the device assembly 80.

In one or more embodiments, a number N of capacitances for the charge reuse driver circuit block 710 may be fixated to the pins, e.g., N=4 capacitances soldered to the pins, while series resistances between tank capacitances $C_1$, $C_2$, $C_5$, $C_6$ are preferably minimized.

For instance, each tank capacitance may have a given value, e.g., $C_1=C_2=C_5=C_6=220$ nF (1 nF=1 nanoFarad=$10^{-9}$ Farad).

In one or more embodiments, optional capacitances may have a value equal to the value of tank capacitance or different values, e.g., the capacitance coupled to the pin VREF may be equal to 220 nF, while the capacitance coupled to the pin VHV may have a value of 1 microFarad (1 microFarad=$10^{-6}$ Farad).

It is noted that what discussed herein with respect to the driver device and circuit for a piezoelectric load may be applied to micro-mirrors but also to other electrically powered actuators. For instance, one or more embodiments may be found suitable for applications such as time-of-flight, pico-projection, augmented reality and virtual reality.

One or more embodiments comprise a method, which may comprise:

providing a load capacitance (for instance, $C_L$) having a charge node (for instance, 104);

providing a set of energy storage capacitances (for instance, $C_1$, $C_2$), having respective charge nodes (for instance, 101, 102); and providing electronic switch circuitry (for instance, 20) configured to be made selectively conductive to couple the charge node of the load capacitance to respective charge nodes of energy storage capacitances in the set of energy storage capacitances, wherein the electronic switch circuitry comprise a switched current path (for instance, T, L) through a first transistor (for instance, $TT_1$) and a second transistor (for instance, $TT_2$) including junction diodes (for instance, BD1, BD2), wherein the first transistor (for instance, $TT_1$) has a current path therethrough between a first common node (for instance, SS) and the respective charge node of an energy storage capacitance (for instance, $C_1$) in the set of energy storage capacitances and the second transistor has a current path therethrough between the first common node and the charge node of the load capacitance, the first transistor and the second transistor having control terminals mutually coupled at a second common node (for instance, GG), the control terminals having a parasitic capacitance (for instance, $C_P$), wherein the method may comprise pre-charging (for instance, 40) the parasitic capacitance (for instance, $C_P$) of the control terminals of the first transistor and the second transistor mutually coupled at the second common node prior to making conductive the switched current path through the first transistor and the second transistor.

In one or more embodiments, the electronic switch circuitry (20) may comprise:

a first auxiliary switched (for instance, 301) current path between the second common node and said respective charge node of an energy storage capacitance (for instance, $C_1$) in the set of energy storage capacitances; and a second auxiliary switched (for instance, 302) current path between the second common node and the charge node of the load capacitance, wherein pre-charging (for instance, 40) said parasitic capacitance comprises making conductive (for instance, AUX_on) either one of said first and second auxiliary switched current paths.

In one or more embodiments, the method may comprise providing at the charge node of the load capacitance a drive voltage signal (for instance, $V_L$) comprising a sequence of rising and falling edges between a supply voltage at a voltage supply node (for instance, VHV) and ground (for instance, GND), wherein:

at the rising edges, the charge node of the load capacitance is subsequently coupled, in an ordered sequence:
 to ground,
 to respective charge nodes (for instance, 101, 102) of the energy storage capacitances in the set of energy storage capacitances to receive charge therefrom, and
 to the voltage supply node; and at the falling edges, the charge node of the load capacitance is subsequently coupled, in an ordered sequence:
 to the voltage supply node,
 to respective charge nodes of energy storage capacitances in the set of energy storage capacitances to transfer charge thereto, and
 to ground.

In one or more embodiments:

the drive voltage signal may comprise an alternated sequence of rising and falling edges; and pre-charging said parasitic capacitance may comprise an alternated sequence of making conductive said first and said second auxiliary switched current paths.

In one or more embodiments, pre-charging said parasitic capacitance may comprise making conductive:

the first auxiliary switched current path (for instance, 301) at the falling edges, and the second auxiliary switched current path (for instance, 302) at the rising edges.

In one or more embodiments, pre-charging said parasitic capacitance up to a pre-charge level may be a function of a difference between the voltage at said respective charge node of an energy storage capacitance (for instance, $C_1$) in the set of energy storage capacitances and the voltage (for instance, $V_L$) at the at least one charge node of the load capacitance.

In one or more embodiments, the method may comprise:

sensing (for instance, B1, B2, M1, M2, Mc) a pre-charge current (for instance, Iprech) pre-charging the parasitic capacitance (for instance, $C_p$) of the control terminals of the first transistor and second transistor; and discontinuing (for instance, P3, comp_out, PRECH) pre-charging the parasitic capacitances (for instance, $C_p$) of the control terminals of the first transistor (for instance, $TT_1$) and second transistor (for instance, $TT_2$) as a result of the intensity of the pre-charge current sensed (for instance, Iprech, Imirr) reaching a reference intensity value (for instance, $I_{ref}$).

One or more embodiments may comprise a circuit, which may comprise:

a load charge node (for instance, 104) configured to be coupled to a load capacitance (for instance, $C_L$);

an energy storage charge node (for instance, 101) configured to be coupled to an energy storage capacitance (for instance, $C_1$); and electronic switch circuitry (for instance, 20) configured to be made selectively conductive to couple the load charge node to the energy storage node, wherein the electronic switch circuitry (for instance, 20) comprise a switched current path (for instance, T, L) through a first transistor (for instance, $TT_1$) and a second transistor (for instance, $TT_2$) including junction diodes (for instance, BD1, BD2), wherein the first transistor has a current path therethrough between a first common node (for instance, SS) and the energy storage charge node and the second transistor has a current path therethrough between the first common node and the load charge node, the first transistor and the second transistor having control terminals mutually coupled at a second common node (for instance, GG), the control terminals having a parasitic capacitance (for instance, $C_P$), wherein the circuit may comprise pre-charge circuitry (for instance, 301, 302) configured to operate with one or more embodiments of a method to pre-charge (for instance, 40) the parasitic capacitance of the control terminals of the first transistor and the second transistor mutually coupled at the second common node.

In one or more embodiments, the circuit may comprise:

at least one pre-charge current generator (for instance, Iprech) coupled to the second common node to provide said pre-charge current at the second common node;

a comparator circuit (for instance, R1, R2, 310, 210) configured (for instance, B1, B2, M1, M2, MC) to:

compare with a reference intensity value (for instance, $I_{ref}$) the intensity of the pre-charge current (for instance, Iprech, Imirr), provide a de-activation signal (for instance, comp_out) to the pre-charge generator (for instance, Iprech) to discontinue (for instance, P3) pre-charging (for instance, 40) the parasitic capacitance (for instance, $C_P$) of the control terminals of the first transistor and second transistor as a result of the intensity of the pre-charge current sensed (for instance, Iprech, Imirr) reaching the reference intensity value (for instance, $I_{ref}$), and current mirror circuitry (for instance, B1, B2, M1, M2) intermediate the at least one pre-charge current generator and the comparator circuit the current mirror circuitry configured to mirror towards the comparator circuit the pre-charge current provided by the at least one pre-charge current generator.

One or more embodiments may comprise a device, which may comprise:

at least one circuit according to one or more embodiments; and a capacitive load (for instance, 800) coupled to the said load charge node (for instance, 104) and providing load capacitance (for instance, $C_L$) at said charge node (104).

In one or more embodiments:

the capacitive load may comprise a piezoelectric load; and/or the load charge node may be configured to be selectively coupled to a voltage supply node (for instance, VHV) at a voltage up to 40V.

In one or more embodiments, the capacitive load may comprise a micro-mirror.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

What is claimed is:

1. A method comprising:

pre-charging a parasitic capacitance of a control node that is coupled to a control terminal of a first transistor of an electronic switch and to a control terminal of a second transistor of the electronic switch, the first transistor having a current path coupled to a current path of the second transistor, wherein the first and second transistors have respective junction diodes, wherein the current path of the first transistor and the current path of the second transistor form a switched current path coupled between a load node that is coupled to a load capacitance and a storage node that is coupled to a set of energy storage capacitances, wherein pre-charging the parasitic capacitance comprises:

making conductive a first auxiliary transistor that has a current path coupled between the storage node and the control node, or making conductive a second auxiliary transistor that has a current path coupled between the load node and the control node; and after pre-charging the parasitic capacitance, making the switched current path conductive to couple the load node to the storage node.

2. The method of claim 1, further comprising providing at the load node a drive voltage signal comprising a sequence of rising and falling edges between a supply voltage at a voltage supply node and ground, wherein:

at the rising edges, the load node is sequentially coupled, in an ordered sequence:

to ground,
to respective charge nodes of energy storage capacitances of the set of energy storage capacitances via the storage node, and
to the voltage supply node; and at the falling edges, the load node is sequentially coupled, in an ordered sequence:
to the voltage supply node,
to the respective charge nodes of the energy storage capacitances of the set of energy storage capacitances via the storage node, and
to ground.

3. The method of claim 2, wherein:

the drive voltage signal comprises an alternated sequence of rising and falling edges, and
pre-charging the parasitic capacitance comprises an alternated sequence of making conductive the first and second auxiliary transistors.

4. The method of claim 2, wherein pre-charging the parasitic capacitance comprises making conductive:

the first auxiliary transistor at the falling edges; and
the second auxiliary transistor at the rising edges.

5. The method of claim 2, wherein the supply voltage is higher than 30 V.

6. The method of claim 1, wherein pre-charging the parasitic capacitance comprises pre-charging the parasitic capacitance up to a pre-charge level which is a function of a difference between a voltage at the storage node and a voltage at the load node.

7. The method of claim 1, further comprising:

sensing a pre-charge current pre-charging the parasitic capacitance; and
discontinuing pre-charging the parasitic capacitance with a first pre-charge current source when the sensed pre-charge current reaches a reference value.

8. The method of claim 7, wherein pre-charging the parasitic capacitance comprises:

after making conductive the first auxiliary transistor or the second auxiliary transistor, turning off the first auxiliary transistor or the second transistor and begin supplying the pre-charge current to the parasitic capacitance.

9. The method of claim 8, wherein supply the pre-charge current to the parasitic capacitance comprises turning on the first pre-charge current source and turning on a second pre-charge current source.

10. The method of claim 9, wherein the second pre-charge current source remains enabled after discontinuing pre-charging the parasitic capacitance with the first pre-charge current source.

11. The method of claim 1, wherein a piezoelectric load comprises the load capacitance.

12. A circuit comprising:

a load node configured to be coupled to a load capacitance;
an energy storage node configured to be coupled to a set of energy storage capacitances;
a switched current path configured to be made selectively conductive to couple the load node to the energy storage node;
a first transistor and a second transistor, the first transistor and the second transistor comprising respective junction diodes, wherein the first transistor has a first current path coupled between a first common node and the energy storage node, wherein the second transistor has a second current path coupled between the first common node and the load node, the switched current path comprising the first current path and the second current path, wherein the first transistor and the second transistor have respective control terminals mutually coupled at a second common node having a parasitic capacitance;
a first auxiliary transistor having a current path coupled between the energy storage node and the second common node; and
a second auxiliary transistor having a current path coupled between the load node and the second common node, wherein the circuit is configured to:
pre-charge the parasitic capacitance by making conductive the first auxiliary transistor or the second auxiliary transistor, and
after pre-charging the parasitic capacitance, making the switched current path conductive to couple the load node to the storage node.

13. The circuit of claim 12, further comprising:
a pre-charge current generator coupled to the second common node and configured to provide a pre-charge current to the second common node; and
a comparator configured to:
compare a sense current sensed from the second common node with a reference current, and
provide a de-activation signal to the pre-charge current generator to turn off the pre-charge current generator when the sense current reaches the reference current.

14. The circuit of claim 13, further comprising a current mirror coupled between the pre-charge current generator and the comparator.

15. The circuit of claim 13, wherein the circuit is further configured to turn off the first auxiliary transistor or the second auxiliary transistor after making conducting the first auxiliary transistor or the second auxiliary transistor, and wherein the pre-charge current generator is configured to provide the pre-charge current to the second common node after turning off the first auxiliary transistor or the second auxiliary transistor.

16. The circuit of claim 15, further comprising a second pre-charge current generator coupled to the second common node and configured to provide a second pre-charge current to the second common node when the first and second auxiliary transistors are off.

17. The circuit of claim 12, wherein the circuit is configure to pre-charge the parasitic capacitance up to a pre-charge level that is a function of a difference between a voltage at the storage node and a voltage at the load node.

18. A device comprising:
a capacitive load;
a storage capacitor; and
a circuit comprising:
a load node coupled to the load capacitance,
an energy storage node coupled to the storage capacitance,
a switched current path configured to be made selectively conductive to couple the load node to the energy storage node,
a first transistor and a second transistor, the first transistor and the second transistor comprising respective junction diodes, wherein the first transistor has a first current path coupled between a first common node and the energy storage node, wherein the second transistor has a second current path coupled between the first common node and the load node, the switched current path comprising the first current path and the second current path, and wherein the first transistor and the second transistor have respective control terminals mutually coupled at a second common node having a parasitic capacitance,
a first auxiliary transistor having a current path coupled between the energy storage node and the second common node, and
a second auxiliary transistor having a current path coupled between the load node and the second common node, wherein the circuit is configured to:
pre-charge the parasitic capacitance by making conductive the first auxiliary transistor or the second auxiliary transistor, and
after pre-charging the parasitic capacitance, making the switched current path conductive to couple the load node to the storage node.

19. The device of claim 18, wherein the load node is configured to be selectively coupled to a voltage supply node at a voltage up to 40V.

20. The device of claim 18, wherein the capacitive load comprises a micro-mirror.

* * * * *